(12) United States Patent
Uzoh

(10) Patent No.: US 8,946,899 B2
(45) Date of Patent: Feb. 3, 2015

(54) VIA IN SUBSTRATE WITH DEPOSITED LAYER

(75) Inventor: Cyprian Emeka Uzoh, San Jose, CA (US)

(73) Assignee: Invensas Corporation, San Jose, CA (US)

( * ) Notice: Subject to any disclaimer, the term of this patent is extended or adjusted under 35 U.S.C. 154(b) by 155 days.

(21) Appl. No.: 13/556,339

(22) Filed: Jul. 24, 2012

(65) Prior Publication Data

US 2014/0027922 A1     Jan. 30, 2014

(51) Int. Cl.
*H01L 23/48*     (2006.01)
*H01L 21/02*     (2006.01)

(52) U.S. Cl.
CPC ................................. *H01L 21/02107* (2013.01)
USPC ............................................ 257/762; 438/687

(58) Field of Classification Search
CPC ................................................ H01L 21/02107
USPC ............................................................. 257/762
See application file for complete search history.

(56) References Cited

U.S. PATENT DOCUMENTS

| | | | | |
|---|---|---|---|---|
| 4,374,391 | A | * | 2/1983 | Camlibel et al. ............... 257/634 |
| 6,143,597 | A | * | 11/2000 | Matsuda et al. ............... 438/240 |
| 2002/0055256 | A1 | * | 5/2002 | Jiang ............................. 438/687 |
| 2004/0107892 | A1 | * | 6/2004 | Matsumura et al. ............... 117/2 |
| 2006/0172552 | A1 | * | 8/2006 | Ajmera et al. ................ 438/778 |

* cited by examiner

*Primary Examiner* — Ajay K Arora
(74) *Attorney, Agent, or Firm* — Lerner, David, Littenberg, Krumholz & Mentlik, LLP

(57) ABSTRACT

An opening such as a small-diameter via is formed in a semiconductor substrate such as a monocrystalline silicon chip or wafer by a high etch rate process which leaves the opening with a rough interior surface. A smoothing layer such as a polysilicon layer is applied over the interior surfaces of the openings. The smoothing layer presents a surface smoother than the original interior surface. An insulating layer is formed over the smoothing layer or formed from the smoothing layer, and a conductive element such as a metal is formed in the opening. In a variant, a glass-forming material such as BPSG is applied in the opening. The glass-forming material is reflowed to form a glassy insulating layer which presents a smooth surface. The interface between the metal conductive element and the insulating or glassy layer is smooth, which improves mechanical and electrical properties.

13 Claims, 7 Drawing Sheets

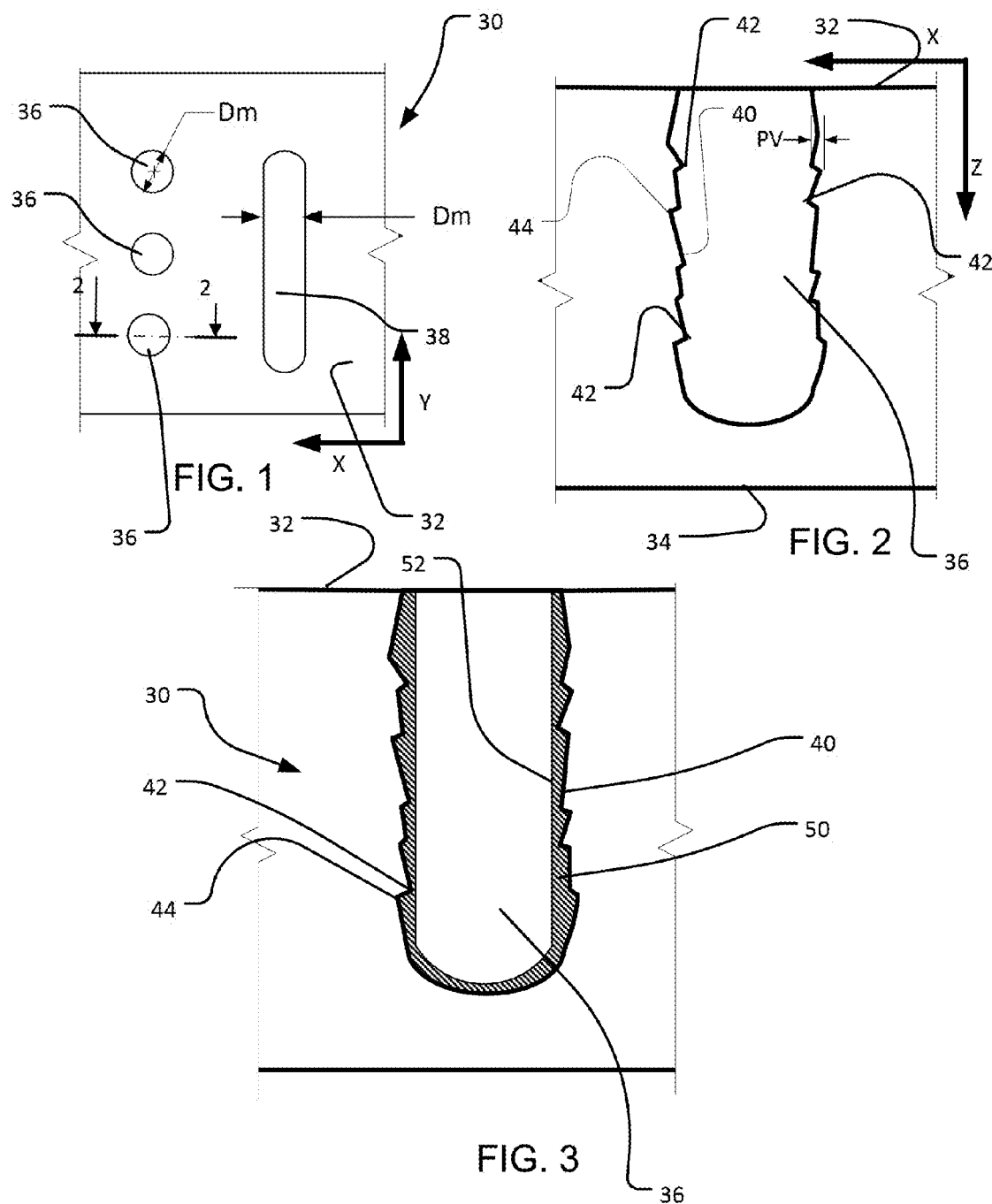

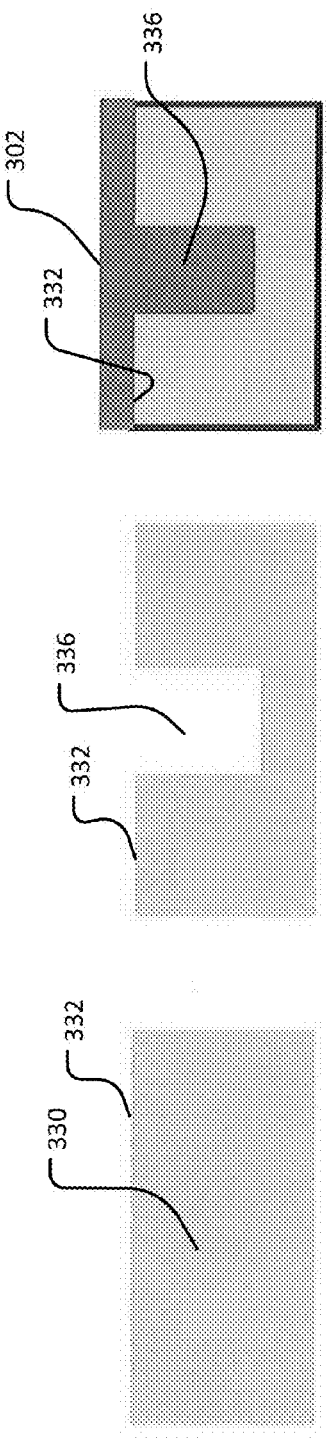
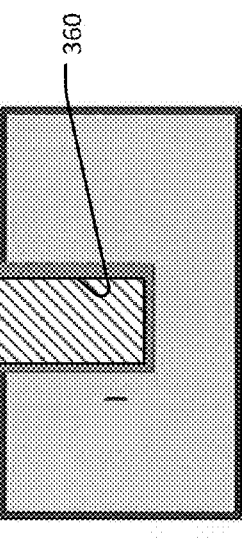
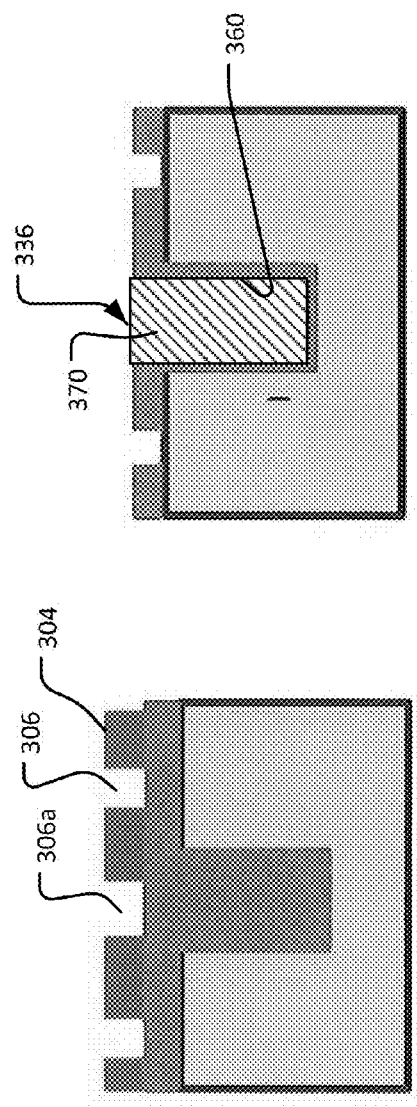
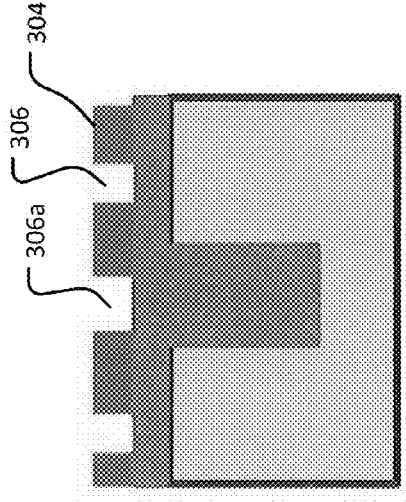
FIG. 14
FIG. 15
FIG. 16
FIG. 17
FIG. 18

VIA IN SUBSTRATE WITH DEPOSITED LAYER

BACKGROUND OF THE INVENTION

The present invention relates to semiconductors, and more particularly relates to the structure of vias in semiconductor substrates and to processes for forming such vias.

Numerous structures used in the electronics industry incorporate semiconductor bodies. Such semiconductor bodies commonly are provided as planar structures having oppositely facing major surfaces. In a common semiconductor chip, the semiconductor body is provided with active semiconductor elements at or near a first one of the major surfaces. The active semiconductor elements typically include doped semiconductor materials deposited on or formed in the body, as well as electrically conductive structures serving as electrodes of the devices. Other electrically conductive structures extend in directions parallel to the plane of the first major surface, commonly referred to as the "X" and "Y" directions. These conductive structures form interconnections between the various semiconductor elements, as well as contacts used to connect the devices to external circuits. These structures may be provided in plural layers overlying one another at or near the first major surface of the semiconductor body.

In some cases, as chip may incorporate openings or "vias" extending through the body in the directions perpendicular to the major surfaces of the semiconductor body, commonly referred to as the "vertical" or "Z"-direction. Such vias commonly are referred to as "through silicon vias." Through silicon vias typically are provided with conductive elements which connect circuit elements on or adjacent the first major surface with contacts on or adjacent the opposite major surface. In this arrangement, external connections can be made to the chip on the opposite major surface in addition to or in lieu of external connections on the first major surface.

The via structure typically includes a dielectric layer lining the opening in the semiconductor body and the conductive element, most commonly formed from a metal, inside the lined opening. The dielectric layer serves to electrically isolate the conductive element from the semiconductor body itself. Where the semiconductor body is formed from silicon, the dielectric can be formed by treating the interior surface of the via at high temperature in an oxidizing environment typically with oxygen, water vapor or both, so as to convert silicon at and near the interior surface into silicon dioxide, which serves as the dielectric. In other cases, a dielectric layer can be deposited in the opening by plasma enhanced chemical vapor deposition ("PECVD").

Other semiconductor substrates are used as interconnection elements in electronic circuitry as, for example, as elements interconnecting chips with larger circuit panels, such as circuit boards, or as elements interconnecting multiple chips with one another. These semiconductor substrates may or may not include active circuit elements, but include electrically conductive elements and dielectric materials insulating the various conductive elements from one another. The conductive elements may be disposed on one or both surfaces of the body. These structures also may incorporate vertically vias extending through the body and conductive elements within such vias.

It is desirable to make the via structures with the smallest possible diameter consistent with other requirements. Great efforts have been devoted in the semiconductor art towards miniaturizing the active circuit elements and conductive structures used on semiconductor chips and other semiconductor bodies so as to pack ever more elements onto the available space, and thus increase the processing power and speed of the circuitry. For example, in modern semiconductor chips, active elements and conductive elements have dimensions in the X- and Y-directions measured in nanometers or microns. Thus, a via which is a few microns in diameter will occupy space that would otherwise be available for tens or hundreds of other elements.

Using specialized anisotropic etching processes, it is possible to form openings in semiconductor bodies having diameters as large as desired, and as small as about 1 micron or less at etch rates up to about 10-20 microns of via depth per minute. One example of such an anisotropic etching process is a species of reactive ion plasma etching process commonly referred to as the Bosch process. However, the available processes for forming openings in silicon and other substrates leave the openings with extremely rough interior surfaces, particularly when these processes are operated at high etch rates.

If the silicon at the interior surface of the opening is treated to convert it into silicon dioxide, the silicon dioxide dielectric will have a correspondingly rough surface. This rough surface will cause difficulties in depositing metal into the lined opening. The rough surface typically has undercut features that are difficult to fill with the metal. Moreover, the exterior surface of the conductive element, at the interface between the conductive element and the dielectric, will be a rough, jagged surface. The jagged surface of the conductor impairs the ability of the conductor to transmit signals at the frequencies used in certain electronic circuits as, for example, at hundreds of MHz or above. This phenomenon is related to the "skin effect", which concentrates high-frequency signals nears the surface of the conductor. If the conductor has a rough surface, the signals are degraded. The jagged surface of the interface between the conductor and the dielectric layer also concentrates electrical charges, which can lead to high leakage of electrical signals through the dielectric layer to the semiconductor body. Further, the jagged surface at the interface between the metal and the dielectric acts to concentrate mechanical stresses in the structure. Such mechanical stresses can arise, for example, when the structure is subjected to temperature changes and the metal in the conductor expands or contracts at a different rate than the silicon body. Concentrated stresses of this nature can cause the structure to fail during use.

The problems associated with the rough interior surfaces of the openings can be alleviated to some extent by reducing the etching rate in the process used to form the openings. However, this reduces productivity and increases the cost. Moreover, it does not fully eliminate the surface roughness in the openings.

Another approach that can be employed to reduce surface roughness is to prolong the process used to convert silicon to silicon dioxide at the interior surfaces of the openings, and thus form a very thick layer as, for example, one to three microns in thickness, at the interior surface of the opening. This thick oxide layer is then etched away until the layer is substantially removed. The etching process that removes the silicon dioxide tends to leave a smoother surface. This smoother surface is then treated again to form a further layer of silicon dioxide dielectric. However, this process requires prolonged exposures to the oxidizing atmosphere at elevated temperature, and thus is expensive. Moreover, this process effectively increases the diameter of the opening. Stated another way, the opening after etching away the thick silicon dioxide layer has a diameter equal to the original interior diameter of the opening plus twice the thickness of the silicon dioxide that is removed during the etching process. This partially defeats the purpose of forming a small opening in the first place.

Accordingly, despite substantial efforts in the art heretofore, further improvement would be desirable.

SUMMARY OF THE INVENTION

One aspect of the invention provides a method of treating a substrate. A method according to this aspect of the invention desirably includes the step of forming an opening extending at least partially through a semiconductor region of a substrate such that a semiconductor material of the semiconductor region is exposed at an interior surface of the opening and the interior surface has surface roughness. The method desirably also includes the step of depositing a smoothing layer onto the interior surface of the opening so that the smoothing layer has an exposed surface with surface roughness less than the surface roughness of the interior surface. The method according to this aspect of the invention desirably further includes the step of forming an insulating layer overlying or integral with the smoothing layer within the opening. The step of forming the insulating layer desirably is performed after the step of depositing the smoothing layer.

The step of forming the insulating layer may include depositing a dielectric material onto the exposed surface of the smoothing layer as, for example, by chemical vapor deposition, to form an insulating layer overlying the smoothing layer. Alternatively, the step of forming an insulating layer may include converting a part or all of the smoothing layer to a dielectric material as, for example, by oxidizing a smoothing layer of polysilicon to silicon dioxide. The method according to this aspect of the invention may further include the step forming an electrically conductive element within the opening, such that the insulating layer is disposed between the electrically conductive element and the interior surface of the opening as, for example, between the conductive element and the smoothing layer.

A further aspect of the present invention provides a structure including a substrate having a body including a semiconductor material, the body having a first surface and an opening extending into the body from the first surface such that the semiconductor material is exposed at an interior surface of the opening. The structure further includes an insulating layer overlying the interior surface and a smoothing layer disposed between the insulating layer and the interior surface of the opening. The smoothing layer desirably is distinct from the insulating layer and from the semiconductor material of the body. Thus, the smoothing layer desirably differs from the body in one more of crystal structure, grain size, and chemical composition. The smoothing layer desirably has a surface roughness less than a surface roughness of the interior surface of the opening. The structure desirably also includes a conductive element disposed within the opening so that the insulating layer is disposed between the smoothing layer and the conductive element.

Desirably, the wherein the smoothing layer has a coefficient of thermal expansion substantially equal to a coefficient of thermal expansion of the semiconductor material in the body. For example, the semiconductor material of the body may consist essentially of monocrystalline semiconductor material including at least one of silicon or a semiconductor alloy of silicon, and the smoothing layer may consist essentially of silicon alone or in combination with at least one of N, C, H, and O, and may be non-monocrystalline, i.e., polycrystalline or amorphous. For example, the smoothing layer may consist essentially of a polycrystalline material such as polysilicon.

Yet another aspect of the present invention provides further methods of treating substrates. A method according to this aspect of the present invention desirably includes the step of forming an opening extending at least partially through a body of a substrate such that a material of the body region is exposed at an interior surface of the opening. The method further desirably includes the step of depositing a smoothing layer onto the interior surface of the opening so that the smoothing layer has an exposed surface with surface roughness less than the surface roughness of the interior surface. Desirably, the method further includes the step of forming an electrically conductive element within the opening so that the smoothing layer is disposed between the electrically conductive element and the interior surface.

The step of forming a smoothing layer may include depositing a glass-forming material into the interior of the opening and reflowing the glass-forming material to form a glass structure. For example, the glass-forming material may be deposited in a layer on the interior surface of the opening. In this case, the reflowing step serves to smooth an exposed surface of the glassy layer prior to formation of the electrically conductive element. Alternatively, the reflowing step may serve to form a glassy plug within the opening. In this case, the method desirably further includes the step of etching the plug so as to leave a layer of the glass on the interior surface of the opening prior to forming the electrically conductive element.

BRIEF DESCRIPTION OF THE DRAWINGS

FIG. 1 is a diagrammatic top plan view depicting a portion of a semiconductor substrate during a process in accordance with one embodiment of the invention.

FIG. 2 is a diagrammatic sectional view taken along line 2-2 in FIG. 1.

FIG. 3 is a view similar to FIG. 2, but depicting the structure at a later stage in the process.

FIGS. 14-18 are further fragmentary sectional views depicting a portion of a substrate during a process according to yet another embodiment of the invention.

DETAILED DESCRIPTION

Figure 4:
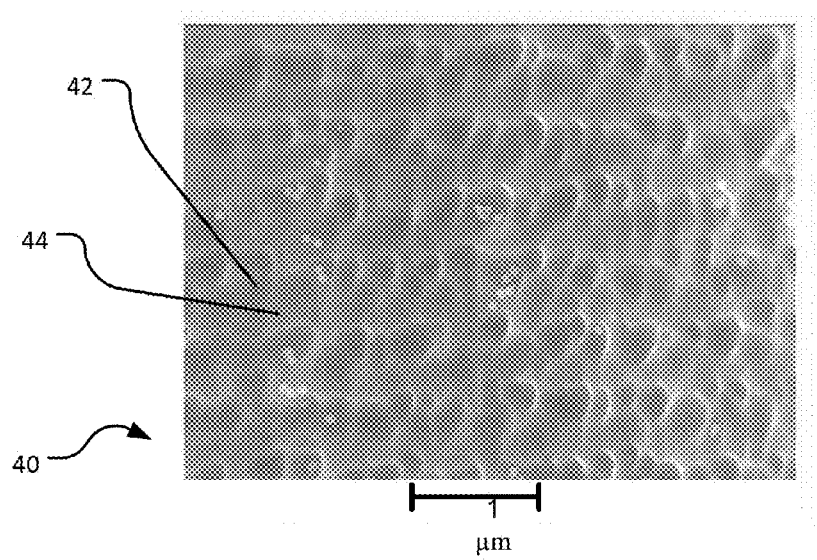
FIG. 4 is an electronic microscope image of a surface at the stage of FIG. 2.

A process in accordance with one embodiment of the invention uses a semiconductor substrate 30 in the form of a body having a first surface 32 visible in FIG. 1 and an oppositely facing second surface 34. Only a small region of body 30 and front surface 32 is depicted in FIG. 1. Body 30 includes a region of substantially monocrystalline semiconductor material, which in this embodiment is silicon, although other semiconductors may be used. In the particular example depicted in FIGS. 1 and 2, the body is composed entirely of a slab of monocrystalline silicon. In other embodiments, the body may also include other structures (not shown) such as semiconductor and conductive layers making up active or passive electronic devices and conductive elements provided as interconnections.

In a first stage of the process, openings 36 extending into the body from first surface 32 are formed. Openings 36 are round, as seen in plan view in FIG. 1, and are generally in the form of right circular cylinders extending in the vertical or Z-direction perpendicular to the plane of surface 32, as indicated by the arrow Z in FIG. 2. In the particular embodiment depicted, the openings also include an opening 38 in the form of an elongated slot extending into the body from surface 32. The length of slot 38 in the Y-direction, parallel to the plane of surface 32, is greater than the width of the slot in the X-direction, also parallel to surface 32. The sizes of openings are described herein with reference to their minimum diameter. In the case of a circular cylindrical opening such as openings 36, the minimum diameter Dm is simply the diameter across the circular opening and is substantially the same in any direction parallel to the plane of surface 32. In the case of a non-circular opening such as slot 38, the minimum diameter Dm is the minimum or width-wise dimension of the slot. The minimum diameter Dm is measured at the midpoint of the via, i.e., the point halfway from surface 32 to the bottom of the via or to the opposite surface of the body if the via extends entirely through the body.

Openings 36 and 38 typically have minimum diameters Dm as small as about 1 micron and as large as desired. Thus, typical ranges for Dm are between about 1 micron and about 500 microns, more commonly between about 1 micron and about 50 microns, and most commonly about 10 microns to about 20 microns. Openings 36 and 38 desirably are formed by a reactive ion plasma etching process. One such reactive plasma etching process is commonly referred to as the Bosch process. In the Bosch process, the first surface 32 of the body is covered by a mask (not shown) with apertures where the openings 36 and 38 are to be formed. The substrate is exposed to a reactive plasma incorporating a fluorine-containing compound such as $SF_6$, which decomposes to form reactive species such as fluorine ions. These reactive species attack the semiconductor body and remove material in the areas that are not covered by the mask, so as to leave a shallow pit in each such area. After this etching phase has been completed, the body is exposed to a further plasma containing a fluorocarbon such as octafluorocyclobutane. The fluorocarbon forms a fluoropolymer passivation layer on the exposed surfaces in the etched pit. The etching phase is then repeated. In the etching phase, the reactive species and other ions in the plasma bombard the bottom of the pit and remove the fluoropolymer passivation layer from the bottom of the pit, which leaving some of the passivation layer on the vertical or nearly vertical sides of the pit. Thus, the silicon around the pit is preferentially etched at the bottom of the pit. The etching and passivation steps are repeated cyclically, so that the pit grows deeper with each step, while desirably maintaining a nearly constant diameter, thus forming the desired narrow, deep opening in the body. The process is continued until the opening reaches the desired depth into the body of the substrate.

Desirably, the etching process is performed at a relatively high etch rate, such as 10 microns per minute or more, and desirably 20 microns per minute or more. As used in this disclosure with reference to an anisotropic etching process forming an opening extending into a substrate, the term the term "etch rate" refers to the rate of growth of the opening in the vertical direction, perpendicular to the exposed face of the substrate.

The interior surface of opening 36 formed in this matter typically has substantial surface roughness. Thus, as schematically shown in FIG. 2, surface 40 incorporates numerous projections 42 and recessed areas 44. The surface roughness is further apparent from FIG. 4, which is a scanning electron microscope image of an interior surface 40 formed by the aforementioned Bosch process. Projections 42 and recesses 44 are clearly visible in this image. The roughness of the surface can be characterized using a measure of the peak-to-valley distance PV perpendicular to the surface between each projection 42 and the neighboring valley. For example, the root mean square surface roughness is the square root of the arithmetic mean of the squares of the individual peak-to-valley distances. Other measures such as the average or maximum peak-to-valley distance may be used. Typically, the peak-to-valley distances are on the order of tens or hundreds of nanometers, as for example, 200 nm in a via of 20 micron diameter. Surface roughness can be measured, for example, by measurements of a scanning electron microscope image of a via cross-section.

After forming the openings 36 and 38, the openings typically are cleaned using a wet etch, dry etch or HF vapor cleaning procedure. In the next step of the process, a smoothing layer 50 (FIG. 3) is deposited onto the interior surface 40 of opening 36. In this embodiment, smoothing layer 50 is deposited in a chemical vapor deposition process using an atmosphere containing silane (SiH4), typically at a temperature of about 250°-550° C. The conditions used for deposition of the smoothing layer may be similar to those commonly used to deposit polycrystalline silicon, commonly referred to as "polysilicon" in known processes. The silicon typically is in an amorphous state, without discernible crystallinity, at the moment it is deposited from the gas phase by decomposition of silane. However, the silicon typically forms numerous small crystals characteristic of polysilicon as the material is held at the temperatures prevailing during the deposition process. Contact between the deposited silicon and the monocrystalline silicon of body 30 exposed at the interior surface 40 of opening 36 may also play a role in development of crystallinity. Most typically, the silicon does not form a monocrystalline body, but remains in a polycrystalline form and thus remains as a distinct layer differing in crystallinity from the monocrystalline body.

Figure 5:
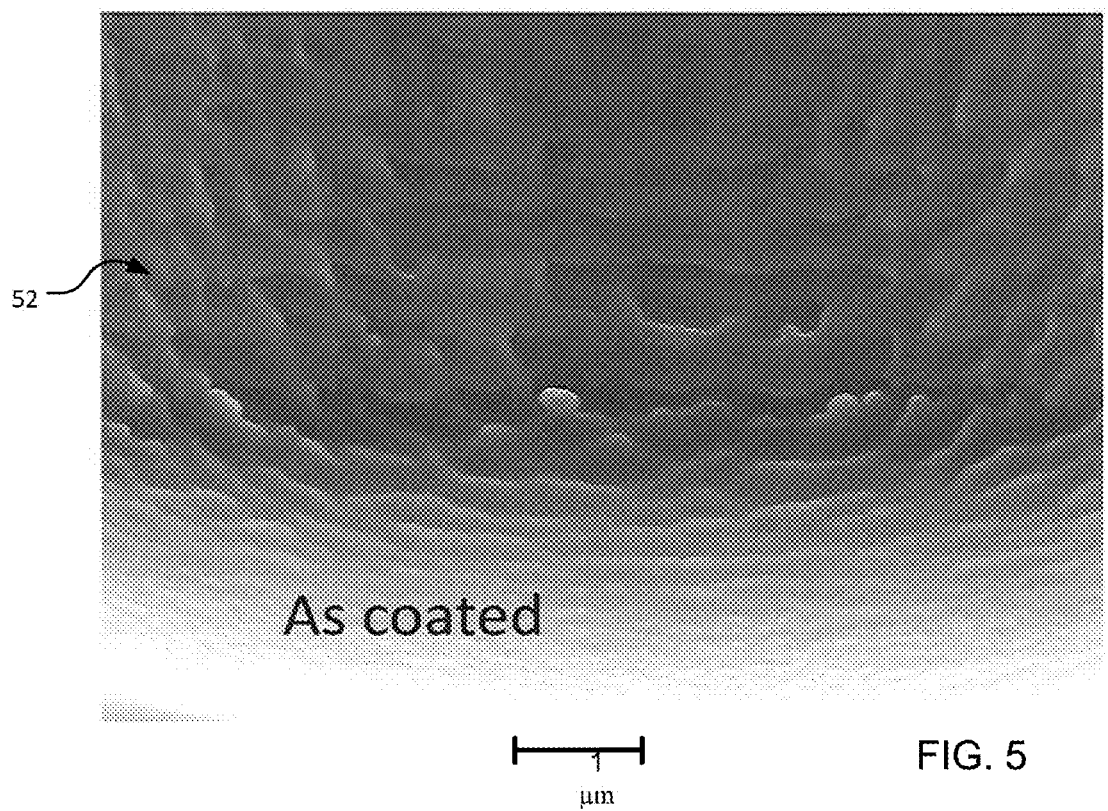
FIG. 5 is an electronic microscope image of a surface at the stage depicted in FIG. 3.
Figure 6:
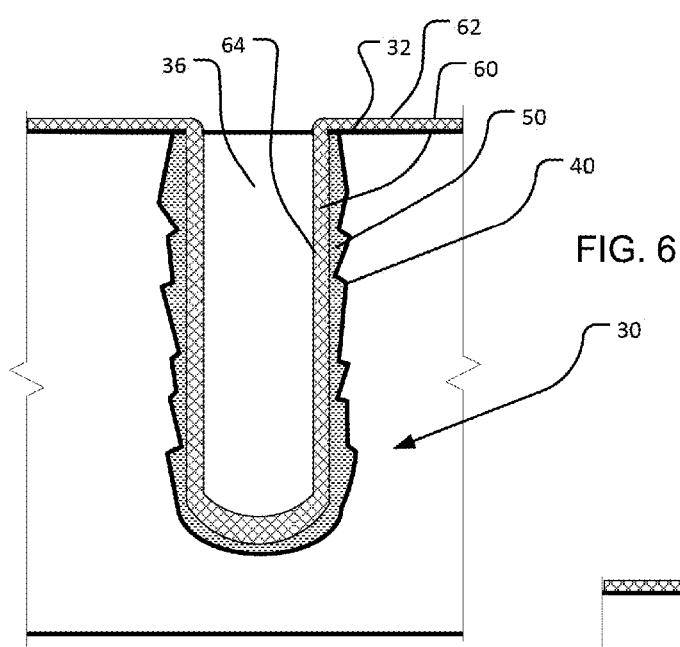
FIGS. 6, 7, and 8 are views similar to FIG. 2, but depicting the structure during progressively later stages of the process.

The deposited silicon defines an exposed surface 52 bounding the open space within opening 36. The silicon tends to deposit preferentially in the recesses 44 of the rough interior surface 40 bounding the opening. Thus, Surface 52 is smoother than the original interior surface 40 of the opening. Surface is depicted schematically in FIG. 3 as a completely smooth surface. In practice, surface 52 has some roughness, but such roughness is substantially less than the roughness of the original interior surface 40. Typically, the root mean square surface roughness of the smoothing layer is less than 50 nm, desirably less than 20 nm, more desirably less than 10 nm, and in some cases less than 1 nm. FIG. 5 shows an electron microscope image of a surface 52 formed by deposition of polysilicon onto an interior surface, as depicted in FIG. 4. Typically, the average thickness of the deposited smoothing layer can be about 50 nm or less in an opening having a minimum diameter of about 5 μm or less as, for example, about 20 nm to 30 nm for openings having minimum diameter between about 1 and 5 μm. For larger openings, slightly thicker smoothing layers can be employed as, for example, about 50-500 nm thick, most preferably about 100-300 nm thick for openings having a minimum diameter from about 20 µm to about 200 µm.

During deposition of smoothing layer 50, a layer of polysilicon (not shown) will also deposit on first surface 32 of body 30 unless the first surface is masked. Polysilicon deposited on first surface 32 may be etched nonselectively to remove all of the additional polysilicon. Because only a relatively thin layer of polysilicon is deposited, the etching process used to remove such layer can be performed readily. Alternatively, polysilicon deposited on first surface 32 may be etched selectively to leave portions of the polysilicon layer in place on the top surface 32 as features of the structure.

In the next stage of the process, an insulating layer 60 is deposited over the smoothing layer 50. In the particular example depicted, insulating layer 60 is formed by plasma enhanced chemical vapor deposition of silicon dioxide. For example, silicon dioxide can be deposited using an atmosphere containing tetra-ethyl-ortho-silicate, also referred to as tetra-ethoxy-silane or "TEOS." The decomposition and deposition may occur at a temperature of about 400° C. or at lower temperatures, down to about 70° C., where active oxygen species such as ozone are present in the deposition atmosphere. The deposited SiO2 typically is amorphous, i.e., substantially non-crystalline. The insulating layer need only have the minimum thickness required to provide a reliable barrier against electrical conduction as, for example, about 10 nm to about 200 nm, more typically about 10 nm to about 50 nm, such as about 10 nm to about 20 nm. Because insulating layer 60 is formed over the smooth exposed surface 52 of smoothing layer 50, the exposed surface 64 of the insulating layer will also be smooth.

During deposition of insulating layer 60, a layer 62 of insulating material is also deposited on top surface 32. This layer overlies any previously existing elements and, thus, can serve as an insulating layer in a structure incorporating multiple layers of elements at the top surface 32. Stated another way, formation of insulating layer 60 may be conducted in conjunction with formation of an additional insulating layer required in other portions of the structure. Here again, the top surface 32 may be masked so as to cover the top surface, except the openings 36, if the additional insulating layer 62 is not desired. Alternatively, the additional insulating layer 62 formed in this process may be etched away, either selectively or nonselectively.

Once the insulating layer 60 has been deposited, the structure presents a via, which is ready for metallization. Typically, an electrically conductive structure 70 is formed within opening 36 by depositing a layer structure 72 on the exposed surface of insulating layer 60. The layer structure may include a seed layer having sufficient conductivity for electroplating. Alternatively or additionally, the layer structure 72 may include one or more adhesion-promoting layers such as titanium or tantalum or titanium nitride, and may include one or more barrier layers intended to prevent diffusion of metals from the conductive structure 70 into the surrounding portions of body 30. For example, where a copper or copper alloy is to form the bulk of the conductive structure, the barrier layers may include one or more metals such as tungsten, tantalum, titanium, and compounds thereof. The layer structure 72 may be deposited by physical vapor deposition, ionized physical vapor deposition, chemical vapor deposition or by wet processes such as electroless plating and electroplating, or by combinations of these processes. The smooth exposed surface 64 of insulating layer 60 facilitates formation of continuous seed and barrier layers. That is, continuous layers covering the entirety of the interior surface 64 of the insulating layer can be built up with relatively little material; the need for excess material to assure the absence of gaps and defects in these layers is minimized. For example, each of the barrier layer may be less than 150 nm thick, and desirably less than about 20 nm thick as, for example, less than 10 nm thick or about 3-5 nm thick. The seed layer may be about 500 nm thick or less. The use of such thin seed and barrier layers reduces the time required to form these layers and thus reduces the cost of the operation. Moreover, the "overburden" or unwanted seed and barrier materials deposited on the exposed first surface 32 of body 30, or on insulating layer 62 overlying the body, is reduced by reducing the amount of material deposited to form the layer itself. This, in turn, reduces the time required to remove the overburden by etching.

Following deposition of the layer structure 72, a bulk conductive metal 74, such as aluminum, copper, tungsten or nickel or alloys or combinations thereof, is deposited within the opening as, for example, by electroplating or vapor deposition.

Figure 7:
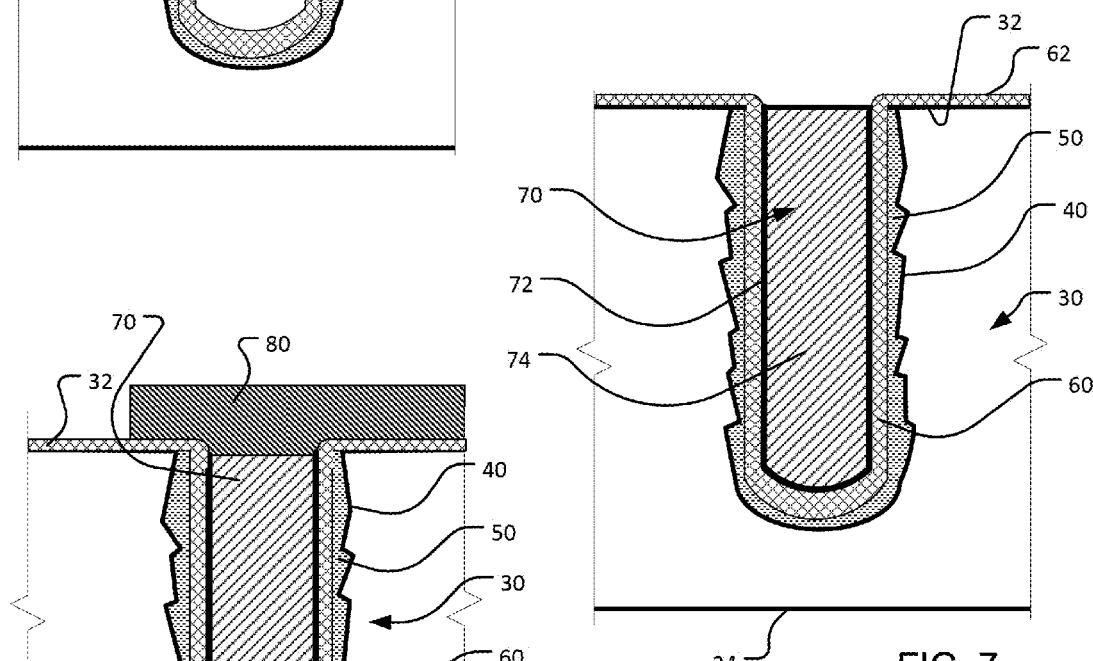
Figure 8:
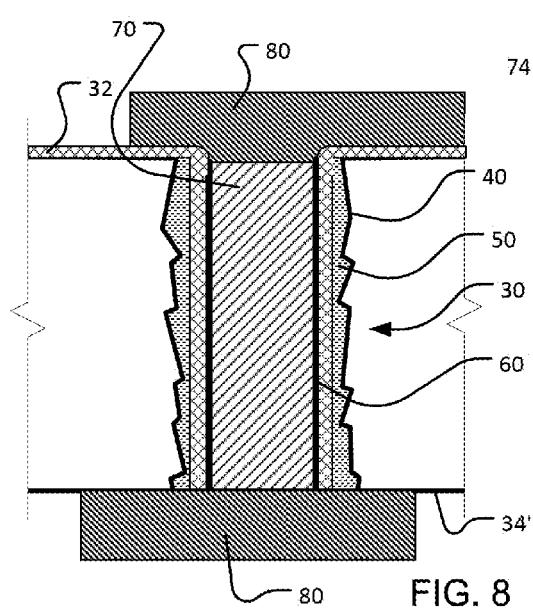

As shown in FIG. 8, the electrically conductive structure 70 is exposed at the second or opposite surface 34' of the body 30 by removing material from the second surface 34 (FIG. 7) so as to form a new second surface 34' closer to the first surface 32. This may be done by removing material from the entire second surface 34, commonly referred to as "thinning" the body, or may be done by removing material from the second surface locally in the vicinity of the openings using a relatively coarse process such as grinding or sandblasting, so as to form depressions in the second surface and thus form the new surface 34' only in the vicinity of the openings. Conductive element 70 thus forms a conductive path through the body 30. Additional conductive elements 80 may be formed on the first and second surfaces of the body as required, so as to complete the desired conductive pathway.

In a variant of the process discussed above, the openings 36 may be initially formed to extend entirely through the body, from first surface 32 to second surface 34, so that the conductive element 74 as formed will extend entirely through the body.

The process as discussed above is well-suited for integration with other semiconductor processing operations. All of the process steps required to deposit the smoothing layer, insulating layer, and conductive structure can be performed at temperatures below about 550° C. These steps can be conducted after formation of features such as active semiconductor elements and other metallic conductors commonly found in semiconductor chips. Stated another way, the conductive vias can be formed as a "back end of line" or "BEOL" process. This is also referred to as a "via last" process. Alternatively, some or all of the process steps can be conducted prior to or during formation of other features as a "front end of line" or "FEOL" process.

The completed via structure has the smoothing layer 50 formed from polysilicon adjacent to the bulk monocrystalline silicon of body 30. The polysilicon smoothing layer 50 has physical properties such as lattice constant and coefficient of thermal expansion very close to those of the bulk monocrystalline silicon. The smoothing layer provides a transition in physical properties between the monocrystalline silicon 30 and the insulating layer 60, which typically is amorphous. Stated another way, the polycrystalline material of the smoothing layer acts as a buffer between the monocrystalline material of body 30 and the amorphous material of insulating layer 60. This significantly enhances the reliability of the structure. Both the polysilicon smoothing layer 50 and the insulating layer 60 act as physical buffers between the conductive structure 70 and the bulk monocrystalline silicon of body 30. The smooth interface between the conductive structure and the insulating layer further contributes to the reliability of the structure. Moreover, the smooth interface facilitates transmission of electrical signals, particularly at frequencies at the gigahertz range and above.

The process discussed above can be varied in numerous ways. For example, materials other than polysilicon can be employed as the material of the smoothing layer. Non-polymeric silicon-bearing materials other than polysilicon, such as silicon in combination with at least one of nitrogen, carbon, hydrogen, and oxygen, can be employed. Desirably, these materials can be deposited on interior surfaces 40 of the opening by processes such as chemical vapor deposition and will preferentially deposit into the recesses in the rough surfaces and thus provide the smoothing layer with an exposed surface smoother than the interior surface 40 of the opening itself. For example, stoichiometric or non-stoichiometric carbides and nitrides of silicon may be deposited. These materials can be applied by chemical vapor deposition processes. Still other dielectrics that may be employed include glasses such as borosilicate glass ("BSG"), phosphosilicate glass ("PSG"), or borophosphosilicate glass ("BPSG"). These glasses can be deposited by chemical vapor deposition of the oxides constituting the glasses. The deposited material may be entirely amorphous, polycrystalline, or monocrystalline. For example, a thin buffer layer such as one or a few atomic layers of carbon can be deposited onto the interior surface 40 of the opening, followed by deposition of the material of the smoothing layer. In some cases, such deposition will lead to formation of crystals with extremely large grain sizes, so that the smoothing layer is effectively a monocrystalline layer.

Insulating layers other than silicon dioxide may be used. For example, materials such as SiCOH, also referred to as organosilicate glass, may be applied as an insulating layer by processes such as plasma-enhanced chemical vapor deposition. Organic materials such as parylene and related materials may be applied by chemical vapor deposition. Materials such as polyimides, fluorinated polyimides, and benzocylobutene polymers can be applied by vapor processes such as CVD. For example, polyimide may be deposited by condensing a diamine and a dianhydride on a surface using CVD or PVD methods, followed by heat-treatment to stabilize the polyimide.

Figure 9:
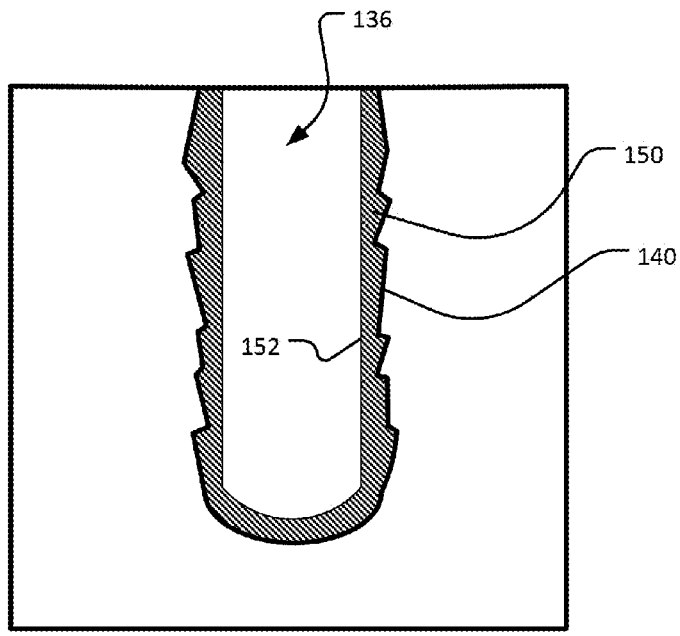
FIGS. 9 and 10 are views similar to FIG. 2, but depicting a portion of a substrate during stages of a process according to a further embodiment of the invention.
Figure 10:
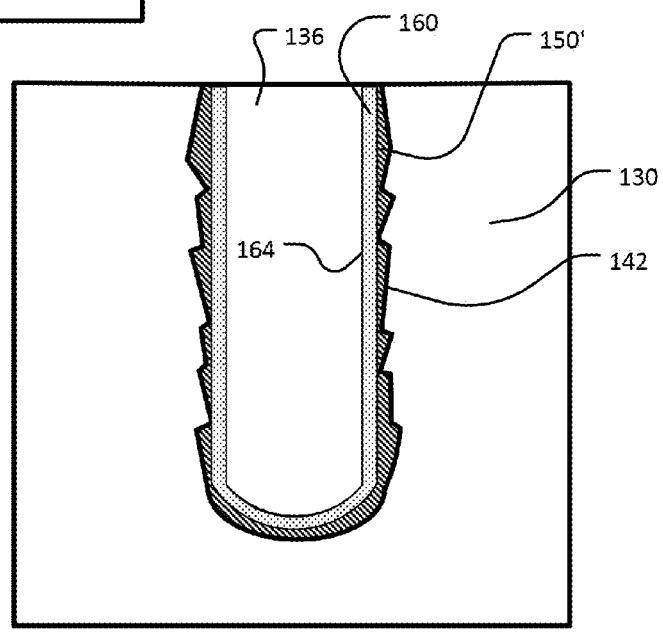
Figure 11:
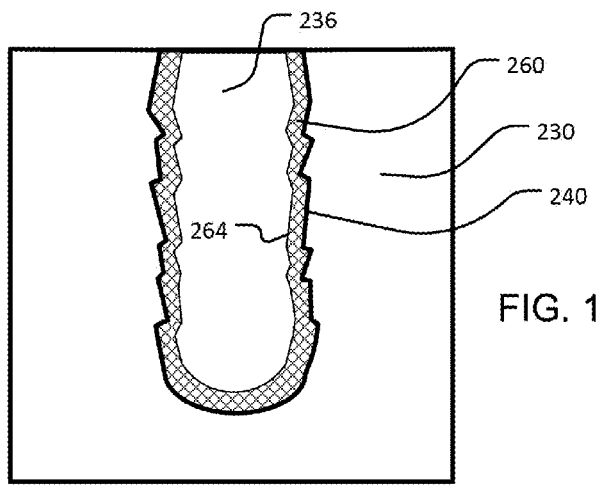
FIGS. 11, 12, and 13 are fragmentary sectional views depicting a portion of a substrate during stages of a process according to yet another embodiment of the invention.
Figure 12:
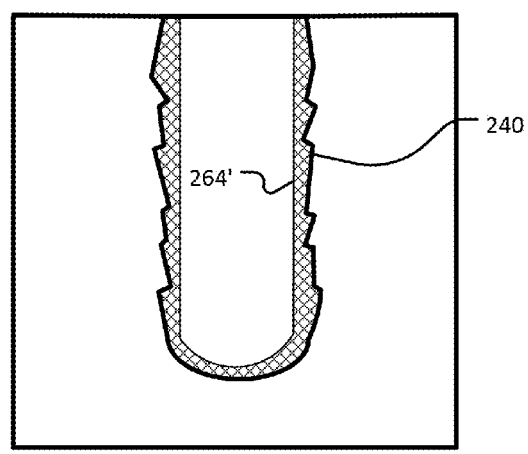
Figure 13:
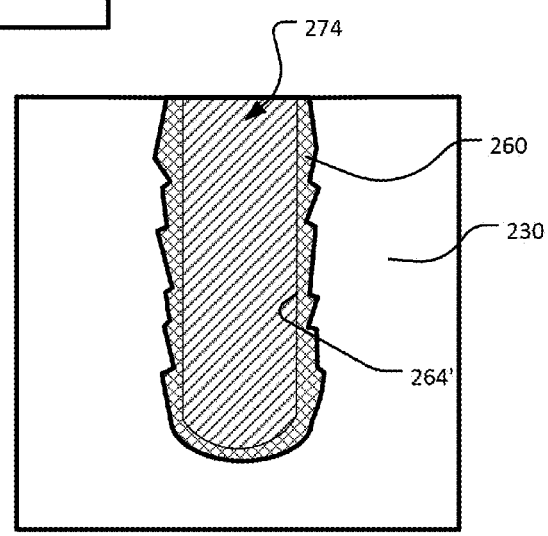

In a further variant, the insulating layer may be formed integrally with the smoothing layer, as by converting all or a portion of the smoothing layer to a dielectric. For example, as seen in FIG. 9, a smoothing layer 150 formed from a silicon-bearing material such as polysilicon is deposited into openings 136 in a manner similar to that discussed above. Here again, the smoothing layer forms an exposed surface 152 smoother than the interior surface 140 of the openings. After depositing of the smoothing layer, the smoothing layer is exposed to oxidizing conditions sufficient to convert the silicon to silicon dioxide. The oxidation reaction proceeds from the exposed surface 152 of the smoothing layer and thus forms an insulating layer 160 lining the opening 136. (FIG. 10.) Here again, the insulating layer 160 defines a smooth interior surface 164. The oxidation process can be relatively brief, as only a small thickness of the smoothing layer, sufficient to provide a pinhole-free dielectric coating, must be converted. For example, only the first few nm of silicon in layer 160 at surface 152 need be converted.

In a further variant, the oxidation or conversion process may be allowed to continue, to the point where some of the original bulk silicon of body 130 is converted to silicon dioxide and forms part of the insulating layer. For example, the silicon at the projections 142 of the original interior surface may be converted. Thus, the smoothing layer 150' remaining after conversion need not be a continuous layer. Indeed, if desired, the conversion process may be allowed to continue until the smoothing layer is entirely converted into an insulating layer. The insulating layer may include portions formed from the original monocrystalline material of the substrate.

In a process according to a further embodiment of the invention, openings 236 are formed in a body 230 of a substrate in essentially the same manner as discussed above. A layer of a glass-forming oxide material such as oxides of silicon mixed with oxides of boron, oxides of phosphorous, or both is deposited directly onto the interior surface 240 of the openings 236 to form a layer 260 of the oxide. At this stage of the process, the oxide layer may have an exposed surface 264 which is relatively rough.

In a further stage of the process, the structure is brought to a temperature sufficient to reflow the oxide. Such reflow typically occurs at temperatures near or above the glass transition temperature of the glass-forming material. For example, borophoshosilicate glass or BPSG will reflow at temperatures between about 750°-850° C. In reflow, the glass acts as a viscous liquid. Thus, surface tension smooths out projections and recesses in surface 264, leaving a reflowed exposed surface 264', which is smoother than the interior surface 240 of the original opening 236. The reflow operation may be performed after deposition of layer 260, by heating the substrate to the temperature required for reflow after deposition. Alternatively, the reflow operation can be performed concurrently with the deposition process, by maintaining the substrate at the reflow temperature during deposition.

The reflowed glass is in an amorphous or glassy state and serves both as a dielectric and as a barrier to diffusion. The phosphorous-containing glasses, such as the phosphosilicate glass formed from the mixed oxides of silicon and phosphorous and borophophosilicate glass formed from the mixed oxides of boron, silicon and phosphorous, are particularly good barriers against diffusion of copper. Following the reflow step, an electrically conductive structure 274 may be formed within the opening, so that the glassy insulating layer 260 formed from the oxides is disposed between the conductive structure 274 and the bulk material 230 of the body. A layer structure, such as a seed or adhesion-promoting layer (not shown), may be applied on the exposed surface 264' of the insulating layer 260. However, a barrier layer typically is not required, even where the conductive structure incorporates copper or other metals that must be kept separate from the semiconductor material of body 230. In this embodiment, the oxide or insulating layer 260 performs the functions of the insulating layer and the smoothing layer discussed above. For an opening having a minor diameter less than about 20 µm, layer 260 may be less than 50 nm thick after reflow as, for example, about 10 to about 20 nm thick.

A process according to a further embodiment of the invention utilizes a substrate having a body 330. (FIG. 14.) Here again, at least that region of the body where the openings are to be provided desirably is formed as a substantially monocrystalline semiconductor structure as, for example, a silicon structure as used in a common semiconductor wafer. Openings 336 (FIG. 15) are formed in the body from the first surface 332 as discussed above and extend at least partially through the body. Here again, the openings have rough interior surfaces.

In the next stage of the process, a glass-forming oxide material 302 is deposited within openings 336. Optionally, the glass-forming oxide material also may be deposited onto surface 332 of the body, as depicted in FIG. 16. During or after deposition of the glass-forming material, it is brought to a temperature at or above its glass transition temperature, so as to fuse the oxide into a substantially glassy material. In this embodiment, the glassy material 302 forms a solid plug filling or substantially filling each opening 336.

In the next stage of the process, a mask 304 (FIG. 17) is applied over the glassy material. The mask has apertures 306 where glassy material is to be removed. One such aperture 306a is disposed in alignment with each opening 336.

An etchant such as, for example, a fluoride-containing wet etchant, is then applied through the mask so as to remove the glassy material selectively. The etchant removes most of the solid plug of glassy material within each opening, leaving each opening 336 with an insulating layer 360. Here again, the insulating layer has a relatively smooth surface. An electrically conductive element, such as a metallic element 370 can be formed in each opening in the manner discussed above. Here again, the glassy layer 360 is disposed between the conductive element and the bulk material of the body 330, so that the glassy layer acts as a barrier to diffusion from the conductive element 370 into the body.

Figure 19:
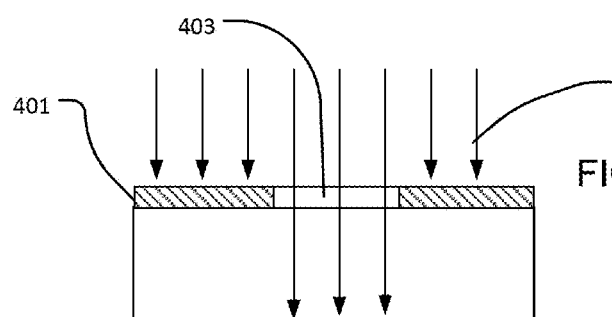
FIGS. 19-22 are further fragmentary sectional views depicting a portion of a substrate during a process according to a further embodiment of the invention.
Figure 20:
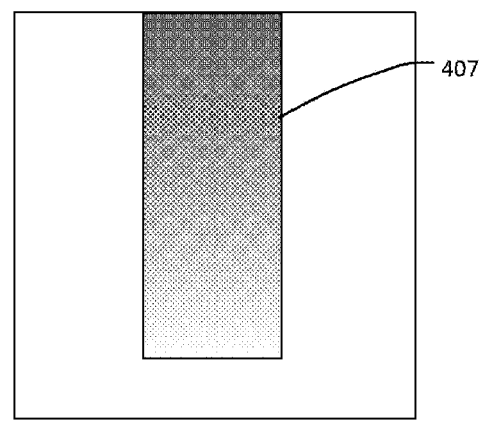
Figure 21:
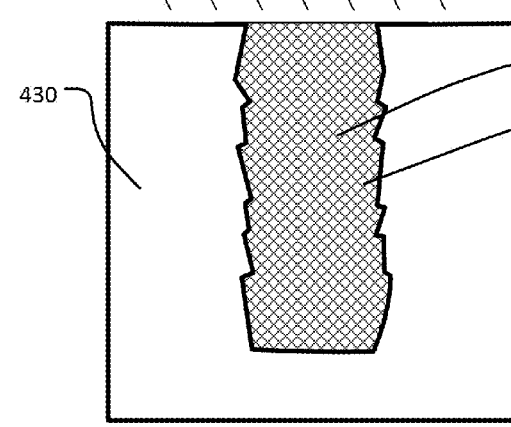

A process according to yet another embodiment of the invention uses a substrate having a body 430 (FIG. 19) formed from a photo-etchable glass. The first surface of the body is covered by a mask 401 such as a metallic mask having apertures 403 at locations where openings are to be formed. The masked body is exposed to radiant energy 405 such as intense ultraviolet radiation. The radiation penetrates into those portions of the body aligned with the apertures and alters the material of the body within those portions, thus forming exposed regions 407 in alignment with the apertures. The substrate is then heat-treated so as to convert the exposed regions 407 to a partially crystalline glass-ceramic material 409. (FIG. 21.) The treated body is then exposed to an etchant such as a liquid hydrofluoric acid etchant 413. The etchant preferentially attacks the glass-ceramic material. The exposing, heat-treating and etching operations can be conducted according to conventional practices for treating photo-etchable glass.

Figure 22:
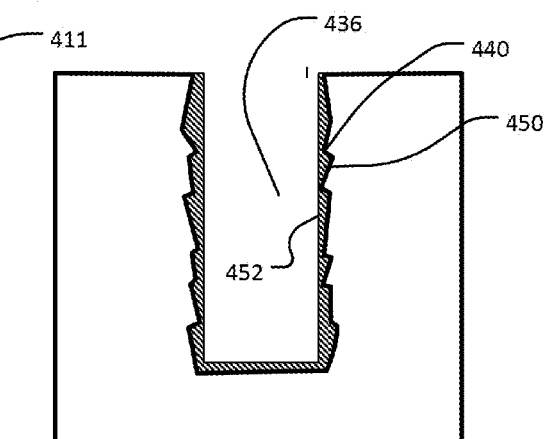

As depicted schematically in FIG. 21, the crystallization process forms an interface 411 between the partially crystalline glass-ceramic material and the surrounding glass of body 430, and this interface has appreciable surface roughness. Thus, the interior surface 440 (FIG. 22) of the opening 436 formed by etching will also have appreciable roughness. A smoothing layer 450 is deposited on the interior surface using any of the processes discussed above. As in the embodiments discussed above, the smoothing layer 450 has an exposed surface 452 smoother than the interior surface 440. A conductive structure (not shown) may be deposited within the opening after formation of the smoothing layer using processes as discussed above. A dielectric layer (not shown) may be deposited on the exposed surface of the spacer layer prior to deposition of the conductive structure. Because the material of body 430 is dielectric, the dielectric layer may be omitted even if the smoothing layer is electrically conductive. However, the dielectric layer can be used with a conductive smoothing layer to provide an electrically conductive structure having a smooth surface.

In the embodiment discussed with reference to FIGS. 19-22, the substrate is not a semiconductor. However, the substrate desirably is a microelectronic substrate. As used in this disclosure, the term "microelectronic substrate" refers to a substrate which is suitable for forming a semiconductor chip and also refers to a substrate which is suitable for use in mounting elements such as semiconductor chips. Typical microelectronic substrates are about 3 mm thick or less, more commonly 1 mm thick or less, and have length and width of a few cm or less. Merely by way of example, a microelectronic substrate formed from a dielectric material may be used as a chip carrier, i.e., an element of a semiconductor chip package to which one or more chips are mounted and which carries electrical terminals connected to the contacts of the chip or chips. The chip or chips can be connected to a circuit board by connecting the terminals of the chip carrier to the conductive elements of the circuit board.

Numerous other variations and combinations of the features set forth above can be employed. For example, materials other than silicon can be employed in the body. Also, a body which has a substantially monocrystalline region may have other regions which are polycrystalline or amorphous. In yet another variant, one or both major surfaces of the body may incorporate indentations so that the body is thinner where the indentations are present, and the openings can be formed these areas.

As these and other variations and combinations of the features discussed above can be used, the foregoing description of certain embodiments should be taken by as merely illustrative of the present invention, and not as limiting the present invention.

The invention claimed is:

1. A semiconductor substrate having:
   (a) a body including a substantially monocrystalline semiconductor material, the body having a first surface;
   (b) an opening extending into the body from the first surface and including an interior surface, the interior surface being comprised of a sidewall surface extending away from the first surface, a bottom surface joined to the sidewall surface, and a plurality of recesses, the semiconductor material being exposed at the interior surface of the opening;
   (c) an insulating layer overlying the interior surface;
   (d) a smoothing layer comprised of polysilicon or amorphous silicon, the smoothing layer disposed between the insulating layer and the interior surface and at least a portion of the smoothing layer disposed within the recesses, the smoothing layer being distinct from the insulating layer and from the semiconductor material of the body, the smoothing layer having a surface roughness less than a surface roughness of the interior surface of the opening; and
   (e) a conductive element disposed within the opening so that the insulating layer is disposed between the smoothing layer and the conductive element.

2. The substrate as claimed in claim 1 wherein the smoothing layer has a coefficient of thermal expansion substantially equal to a coefficient of thermal expansion of the semiconductor material.

3. The substrate as claimed in claim 1 wherein the semiconductor material of the body has a grain size, and wherein the smoothing layer has a grain size smaller than the grain size of the semiconductor material of the body.

4. The substrate as claimed in claim 1 wherein the each of the semiconductor material of the body and the smoothing layer consists essentially of materials independently selected from the group consisting of silicon and compounds of silicon with one or more elements selected from the group consisting of N, C, H, and O.

5. The substrate as claimed in claim 1 wherein the insulating layer consists essentially of one or more compounds of silicon with one or more elements selected from the group consisting of N, C, H, and O.

6. The substrate as claimed in claim 2 wherein the insulating layer includes a glass.

7. The substrate as claimed in claim 6 wherein the glass includes a boron-containing glass and the conductive element includes copper.

8. A semiconductor substrate having:
  (a) a body including a semiconductor material, the body having a first surface;
  (b) an opening having a minor diameter of about 500 μm or less extending into the body from the first surface such that the semiconductor material is exposed at an interior surface of the opening, the interior surface of the opening being comprised of a sidewall surface extending away from the first surface, a bottom surface joined to the sidewall surface, and a plurality of recesses, the interior surface having a first surface roughness of at least 100 nm;
  (c) an insulating layer overlying the interior surface, the insulating layer having a surface roughness of less than 20 nm; and
  (d) a smoothing layer, at least portions of the smoothing layer and the body integrally formed with the insulating layer, and at least portions of the smoothing layer disposed within the recesses.

9. The substrate as claimed in claim 8 wherein the insulating layer consists essentially of one or more compounds of silicon with one or more elements selected from the group consisting of N, C, H, and O.

10. The substrate as claimed in claim 8 further comprising an electrically conductive element disposed within the opening so that the insulating layer is disposed between the conductive element and the body.

11. A microelectronic substrate having:
  (a) a body having a first surface;
  (b) an opening extending into the body from the first surface such that material of the body defines an interior surface of the opening, the interior surface being comprised of a sidewall surface extending away from the first surface, a bottom surface joined to the sidewall surface, and a plurality of recesses, the material comprising a semiconductor, the interior surface of the opening having a first surface roughness;
  (c) a monocrystalline smoothing layer overlying the interior surface, the smoothing layer including a glass and having a surface roughness less than the first surface roughness, at least a portion of the smoothing layer being disposed within the recesses; and
  (d) an electrically conductive element disposed within the opening so that the smoothing layer is disposed between the conductive element and the body.

12. The substrate as claimed in claim 11, wherein the electrically conductive element includes copper.

13. The substrate as claimed in claim 1, wherein the monocrystalline semiconductor material is a monolithic monocrystalline semiconductor material.

* * * * *